(12) United States Patent
Chen et al.

(10) Patent No.: US 11,211,357 B2
(45) Date of Patent: Dec. 28, 2021

(54) METHOD FOR PROCESSING AN ULTRA-HIGH DENSITY SPACE INTERCONNECT LEAD UNDER LIGHT SOURCE GUIDANCE

(71) Applicant: GUANGDONG UNIVERSITY OF TECHNOLOGY, Guangdong (CN)

(72) Inventors: Yun Chen, Guangdong (CN); Shuquan Ding, Guangdong (CN); Yunbo He, Guangdong (CN); Maoxiang Hou, Guangdong (CN); Xin Chen, Guangdong (CN); Jian Gao, Guangdong (CN); Ni Zhao, Guangdong (CN); Lanyu Zhang, Guangdong (CN); Zhengping Wang, Guangdong (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/037,909

(22) Filed: Sep. 30, 2020

(65) Prior Publication Data
US 2021/0210461 A1 Jul. 8, 2021

(30) Foreign Application Priority Data
Jan. 8, 2020 (CN) .......................... 202010018794.X (51) Int. Cl.
*H01L 23/00* (2006.01)
*B23K 20/00* (2006.01)
(Continued)

(52) U.S. Cl.
CPC ............ *H01L 24/85* (2013.01); *B23K 20/001* (2013.01); *B23K 26/34* (2013.01); *B23K 37/047* (2013.01); *H01L 24/43* (2013.01); *H01L 24/45* (2013.01); *H01L 24/48* (2013.01); *B23K 2101/32* (2018.08); *B23K 2101/38* (2018.08);
(Continued)

(58) Field of Classification Search
None
See application file for complete search history.

(56) References Cited

U.S. PATENT DOCUMENTS 6,352,197 B1 3/2002 Mutaguchi
6,627,922 B1 * 9/2003 Ishinaga ............... H01L 33/486
257/100

FOREIGN PATENT DOCUMENTS

| CN | 103500714 A | 1/2014 |
| CN | 103898622 A | 7/2014 |
| JP | 2014523114 A | 9/2014 |

* cited by examiner

Primary Examiner — Devang R Patel (57) ABSTRACT

A method for processing an ultra-high density interconnect wire under light source guidance, comprising preparing a photo-thermal response conductive paste, and putting it into an air pressure injector; driving the air pressure injector; the air pressure injector extrudes the photo-thermal response conductive paste, so that the photo-thermal response conductive paste is connected with the first chip to form an interconnection wire; stopping extruding the photo-thermal response conductive paste, and driving the air pressure injector to pull off the interconnection wire; a linear light source emits light and irradiates on the interconnection wire to bend to an upper side of a second chip bonding pad; an extrusion mechanism presses a free end of the interconnection wire on the second chip bonding pad; the first chip and the second chip are subjected to glue dripping encapsulation.

9 Claims, 8 Drawing Sheets (51) Int. Cl.
*B23K 26/34* (2014.01)
*B23K 37/047* (2006.01)
*B23K 101/32* (2006.01)
*B23K 103/00* (2006.01)
*B23K 103/08* (2006.01)
*B23K 101/38* (2006.01)

(52) U.S. Cl.
CPC ...... *B23K 2103/08* (2018.08); *B23K 2103/30* (2018.08); *B23K 2103/50* (2018.08); *H01L 2224/435* (2013.01); *H01L 2224/45105* (2013.01); *H01L 2224/45109* (2013.01); *H01L 2224/45193* (2013.01); *H01L 2224/48096* (2013.01); *H01L 2224/48137* (2013.01); *H01L 2224/85039* (2013.01); *H01L 2224/85986* (2013.01)

METHOD FOR PROCESSING AN ULTRA-HIGH DENSITY SPACE INTERCONNECT LEAD UNDER LIGHT SOURCE GUIDANCE

TECHNICAL FIELD

The disclosure relates to the field of microelectronic manufacturing, in particular to a method for processing an ultra-high density interconnection wire under light source guidance.

BACKGROUND OF THE DISCLOSURE

The microelectronic manufacturing technology has an extremely wide application prospect in the fields of aerospace, weapon equipment, medical health and the like, and in recent years, due to the fact that the flexible electronic circuit has the advantages of wearable, intelligent, light weight and the like, it is widely studied. In the processing and manufacturing process of the traditional rigid circuit and the flexible electronic circuit, the wire interconnection process is one of key links, and the high-density interconnection process not only can greatly improve the integration level of the device, but also can improve the transmission efficiency of the signal. Semiconductor three-dimensional packaging technology, such as low-line arc, stacked bonding, on-lead chip, external suspension chip, double-sided bonding and the like, can greatly improve space utilization efficiency, and is an important path for improving integration level. In order to avoid the hidden danger of interference and short circuit of other chips during three-dimensional stacking, the three-dimensional shape wire loop is a desirable strategy in advanced packaging.

In the traditional wire bonding process, the precision motion platform drives the capillary to complete action, the gold wire in the capillary completes the wire bonding process along with the movement, and therefore, the movement track of the capillary required by the two-dimensional and three-dimensional shape wire looping process is very complex. The minimum outer diameter (T value) of the capillary which can be manufactured by the existing equipment in the industry is about 60 micrometers, and the inner diameter is about 20 μm. The technology requires that the electronic-flame-off ball required to be formed at the first welding point needs to be larger than the inner diameter, so that the required interconnection wire diameter is less than 10 μm, a large-span low-arc requirement of pitch between wire bonds is of 20~100 μm in advanced packaging, which are huge challenge for the wire bonding machine. Due to the fact that friction can occur when the inner hole wall of the capillary is in direct contact with the gold wire, and the surface of the gold wire can be damaged to different degrees due to the pulling of the capillary.

SUMMARY OF THE DISCLOSURE

The disclosure aims to provide a method for processing an ultra-high density interconnection wire under light source guidance, so as to solve the problems above.

In order to achieve the purpose, the disclosure adopts the following technical solutions:

A method for processing an ultra-high density interconnection wire under light source guidance, comprising the following steps:

S1, preparing a photo-thermal response conductive paste, and putting the photo-thermal response conductive paste into an air pressure injector;

S2, driving the air pressure injector, so that the micro-nozzle on the air pressure injector is aligned with a central position of a first chip bonding pad; the air pressure injector extrudes the photo-thermal response conductive paste, so that the photo-thermal response conductive paste is connected with the first chip to form an interconnection wire;

S3, the air pressure injector stops extruding the photo-thermal response conductive paste, and drives the air pressure injector to pull off the interconnection wire;

S4: a linear light source emits light and irradiates on the interconnection wire to bend a free end of the interconnection wire and bend to the upper side of a second chip bonding pad;

S5: an extrusion mechanism presses the free end of the interconnection wire on the second chip bonding pad, so that the interconnection wire is connected with the first chip and the second chip;

S6, after the first chip and the second chip are connected, the first chip and the second chip are subjected to glue dripping encapsulation.

In the method for processing an ultra-high density interconnection wire under light source guidance, the photo-thermal response conductive paste includes the following components in parts by weight:

| | |
|---|---|
| 3-(4-((4-methoxyphenyl)diazo)phenoxy)acrylate | 9 parts; |
| diazo-1,2-bis(4,1-phenyl)diacrylate | 1 part; |
| azodiisobutyronitrile | 1.2~1.8 parts; |
| gallium indium alloy (99.99%) | 2 parts; |
| tetrahydrofuran | margin; |

In the method for processing an ultra-high density interconnection wire under light source guidance, a preparation method of the photo-thermal response conductive paste includes the following steps:

Step A1: placing N-isopropylacrylamide, N, N'-methylene bisacrylamide and 2-hydroxy-2-methyl-1-phenyl-1-acetone in dimethyl sulfoxide according to a ratio, and carrying out ultrasonic dispersion for 5 min to obtain a precursor solution;

Step A2: adding the reduced graphene and the eutectic gallium indium alloy (99.99%) into a precursor solution according to a ratio, and performing ultrasonic dispersion for 10 min under a vacuum environment;

Step A3: placing the solution in the Step A2 in an ultraviolet light generator for reaction for 2 min to obtain the photo-thermal response conductive paste.

In the above-mentioned method for processing an ultra-high density interconnection wire under light source guidance, the linear light source is connected with a continuous laser generator, and the wavelength of the light emitted by the continuous laser generator is 532 nm.

In the method for processing an ultra-high density interconnection wire under light source guidance, wherein the photo-thermal response conductive paste includes the following components in parts by weight:

| | |
|---|---|
| 3-(4-((4-methoxyphenyl)diazo)phenoxy)acrylate | 9 parts; |
| diazo-1,2-bis(4,1-phenyl)diacrylate; | 1 part; |
| azodiisobutyronitrile | 1.2~1.8 parts; |

-continued

| | |
|---|---|
| eutectic gallium indium alloy | 2 parts; |
| tetrahydrofuran | margin; |

In the method for processing an ultra-high density interconnection wire under light source guidance, wherein a manufacturing method of the photo-thermal response conductive paste includes the following steps:

Step B1: adding 3-(4-((4-methoxyphenyl) diazo) phenoxy) acrylate, diazo-1,2-bis (4, 1-phenyl) diacrylate and azobisisobutyronitrile into tetrahydrofuran according to a ratio, wherein a reaction temperature is 65° C., and a reaction time is 40~60 h to obtain a precursor solution;

Step B2, drying the precursor solution into a dry matter, a drying temperature is 20° C., and a drying time is 12 h;

Step B3: mixing the eutectic gallium indium alloy with the dry matter according to a ratio, and carrying out vacuum ultrasonic dispersion for 10~15 min to obtain the photo-thermal response conductive paste.

In the above-mentioned method for processing an ultra-high density interconnection wire under light source guidance, the linear light source is connected with a continuous laser generator, and the wavelength of a light emitted by the continuous laser generator is 365 nm.

In the method for processing an ultra-high density interconnection wire under light source guidance, the air pressure injector in the step S3 is moved in the Y-axis direction, and a moving speed is 3~10 mm/s.

In the method for processing an ultra-high density interconnection wire under light source guidance, an irradiation time in the Step S4 is 40 s~60 s.

BENEFICIAL EFFECTS

The interconnection method disclosed by the disclosure through controlling the irradiation time of the light to control the size of the bending angle; The position of the liner light source in the space can also be changed to control the direction of bending of the interconnection wire; Moreover, a plurality of liner light sources can be arranged at different positions of the conductive path to generate a plurality of bending points; Therefore, the bending effect of the interconnection wire is controlled, local damage of the wire is avoided due to the fact that the whole process is in a non-contact guide way, and the requirements of fine line diameter, fine spacing, large span, low line arc and high reliability in advanced packaging are met.

BRIEF DESCRIPTION OF THE DRAWINGS

The disclosure is further described with reference to the drawings, but the contents of the drawings do not constitute any limitations on the disclosure.

In the drawings, a first chip 1, a first chip bonding pad 11, a second chip 2, a second chip bonding pad 21, a interconnection wire 3, a liner light source 4, an air pressure injector 5, an extrusion mechanism 6, and a photo-thermal response conductive paste 7.

DETAILED DESCRIPTION OF EMBODIMENTS

The technical solutions of the disclosure are further illustrated by the following detailed description in conjunction with the accompanying drawings.

Figure 1:
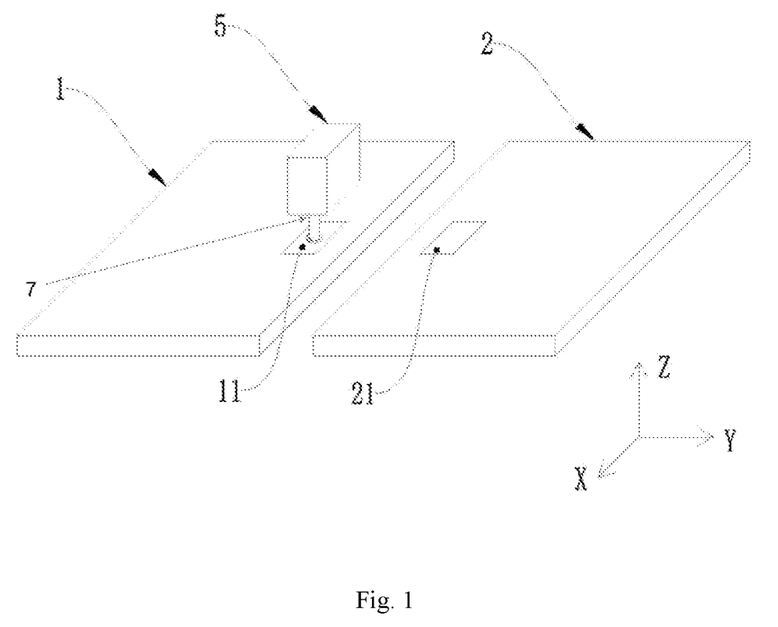
FIG. 1 is a schematic diagram of the process of S2 according to an embodiment of the disclosure.
Figure 2:
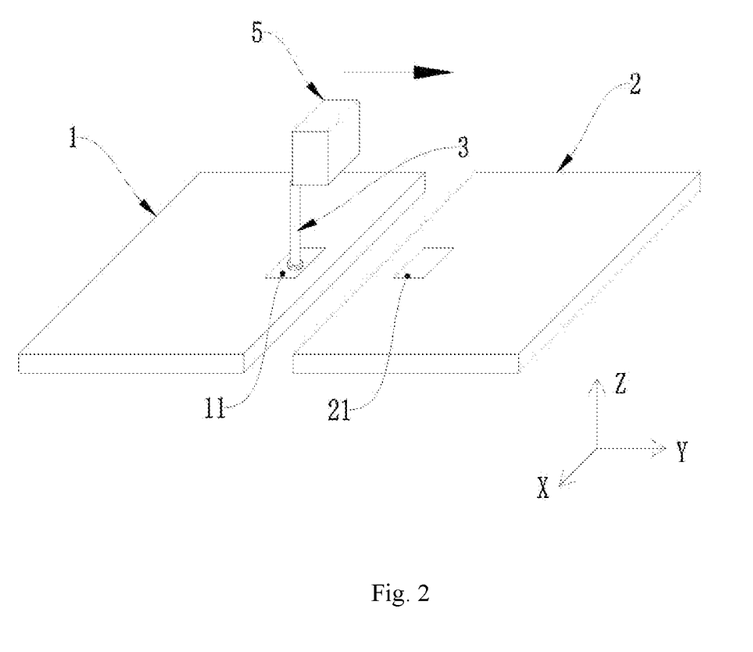
FIG. 2 is a schematic diagram of the process of S3 according to an embodiment of the disclosure.
Figure 3:
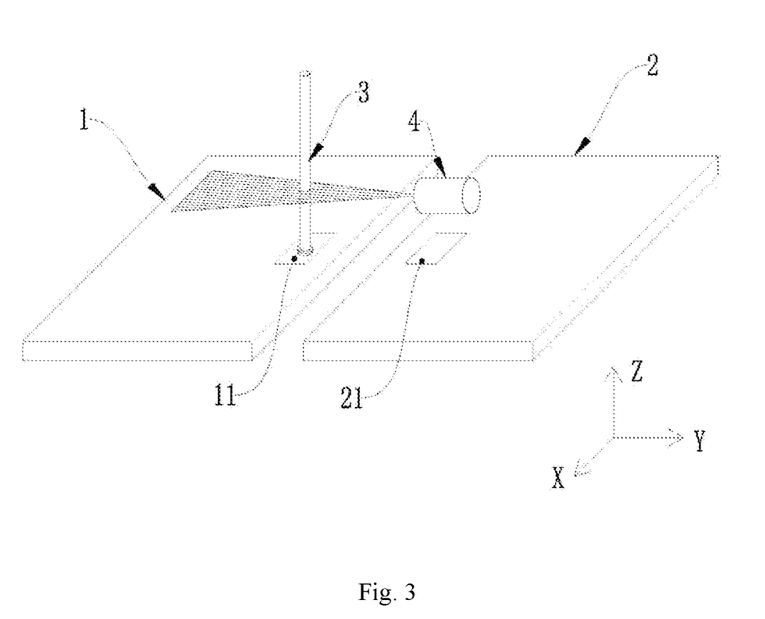
FIG. 3 is a schematic diagram of the process of S4 according to an embodiment of the disclosure.
Figure 5:
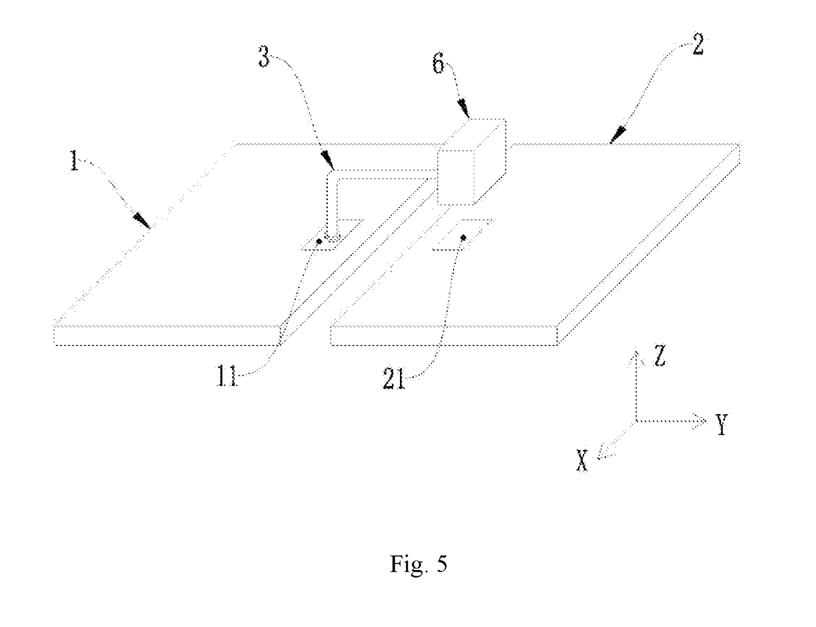
FIG. 5 is a schematic diagram of the process of S5 according to an embodiment of the disclosure.
Figure 6:
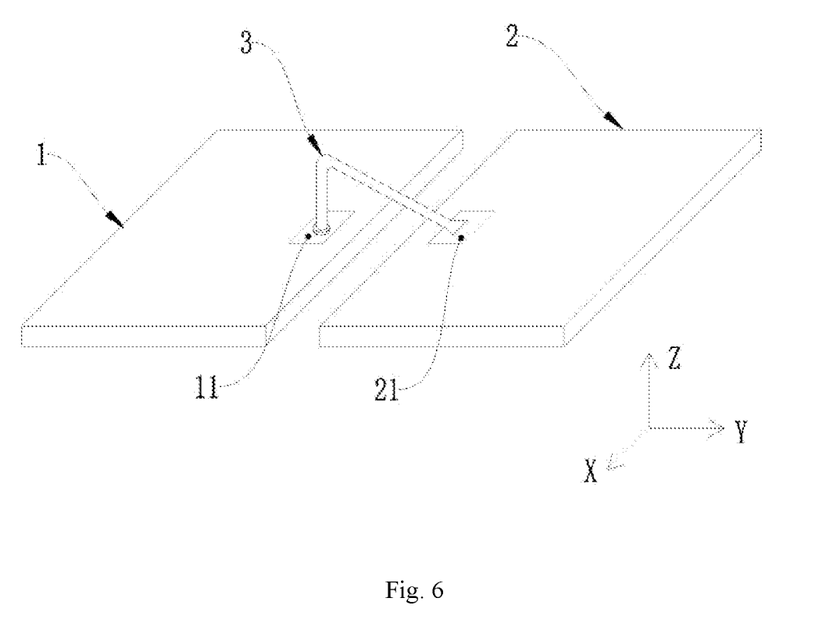
FIG. 6 is a schematic structural diagram of the interconnection wire connecting the first chip and the second chip according to an embodiment of the disclosure.

The disclosure discloses a method for processing an ultra-high density conductive path under light source guidance. The method includes the following steps:

S1, preparing a photo-thermal response conductive paste 7, and putting the photo-thermal response conductive paste 7 into an air pressure injector 5;

S2, driving the air pressure injector 5, so that the micro-nozzle on the air pressure injector 5 is aligned with a central position of a first chip bonding pad 11; the air pressure injector 5 extrudes the photo-thermal response conductive paste 7, so that the photo-thermal response conductive paste 7 is connected with the first chip 1 to form an interconnection wire 3;

S3, the air pressure injector 5 stops extruding the photo-thermal response conductive paste 7, and drives the air pressure injector 5 to pull off the interconnection wire 3;

S4: a linear light source 4 emits light and irradiates on the interconnection wire 3 to bend a free end of the interconnection wire 3 and bend to an upper side of a second chip bonding pad 21;

S5: an extrusion mechanism 6 presses the free end of the interconnection wire 3 on the second chip bonding pad 21, so that the interconnection wire 3 is connected with the first chip 1 and the second chip 2;

S6, after the first chip 1 and the second chip 2 are connected, the first chip 1 and the second chip 2 are subjected to glue dripping encapsulation.

Figure 4:
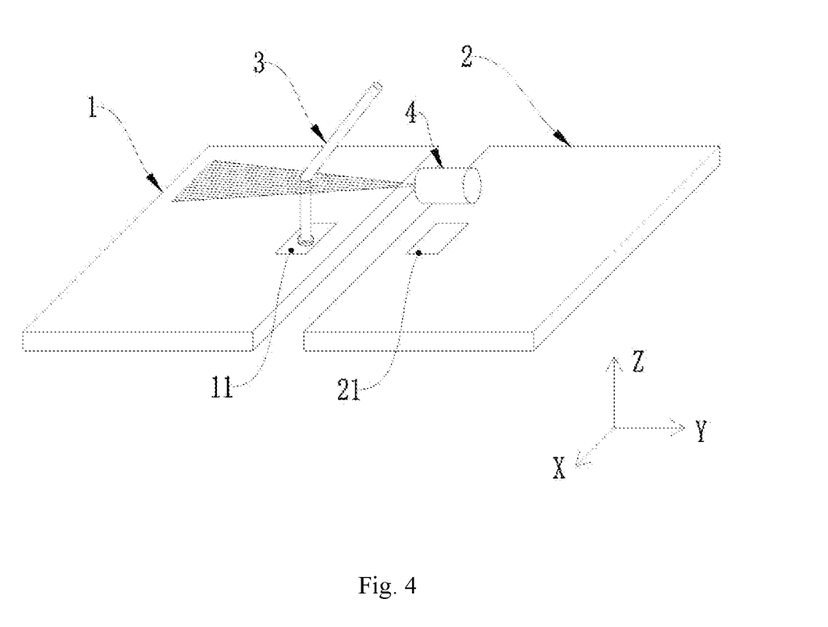
FIG. 4 is a schematic diagram of a bending process of an interconnection wire according to an embodiment of the disclosure.

The principle that the volume change occurs when the photo-thermal response material reaches a critical temperature under the illumination condition is utilized by the disclosure, the photo-thermal response conductive paste 7 is prepared from the photo-thermal conversion material and the conductive material, and the photo-thermal conversion material and the conductive material are made into the photo-thermal response conductive paste 7, the conductive path 3 is prepared by using the photo-thermal response conductive paste 7; the interconnection wire 3 is irradiated by a single-side laser beam, the temperature of a side of the interconnection wire 3 increases due to laser irradiation, and the temperature change on backlit side of the interconnection wire 3 is relatively small, so that the interconnection wire 3 shrinks towards one side of the light, and the volume of the backlit side is basically kept unchanged, so that the purpose of controlling the bending of the interconnection wire 3 to one side of the light source is achieved.

An interconnection method disclosed by the disclosure can control the irradiation time of the light to control the size of the bending angle; The position of the liner light source 4 in the space can also be changed to control the direction of bending of the interconnection wire 3; Moreover, a plurality of liner light sources 4 can be arranged to irradiate on different positions of the interconnection wire 3 to generate a plurality of bending points; therefore, the effect of controlling the bending of the interconnection wire 3 is achieved, and the purpose of bonding a three-dimensional wire of a stacked chip is achieved, the problem of wire bonding can be achieved only by designing a complex capillary trace in the traditional technology is avoided, and damage caused by the contact between the wire and the capillary is avoided.

In a specific embodiment, the precision motion platform (not shown) has a motion precision of 2 μm, and an air pressure injector 5, an air pressure regulator (not shown) and an extrusion mechanism 6 are arranged on the precision motion platform; the air pressure injector 5 is used for loading the photo-thermal response conductive paste 7; the air pressure regulator is used for adjusting the air pressure of the air pressure injector 5 and controlling the extrusion of the photo-thermal response conductive paste 7; and the extrusion mechanism 6 is used for pressing a free end of the interconnection wire 3 on the second chip bonding pad 21.

A micro-nozzle is arranged on the air pressure injector 5; the micro-nozzle is communicated with the air pressure injector 5, and micro-pores are formed in the bottom surface of the micro-nozzle. The micro-pores are arranged in an array, and the number of the micro-pores can be determined according to actual requirements of the number of conductive paths 3 which is not limited herein. The diameter of the micro-pores and the distance between the centers of two adjacent micro-pores can be set according to actual requirements, the diameter of the micro-pores can be 10~50 μm, and the distance between the centers of the two adjacent micro-pores can be 20-100 μm.

Before injection, the air pressure regulator controls the air pressure output to be 0.01 bar; due to the fact that the photo-thermal response conductive paste 7 has certain viscosity, when the air pressure of the air pressure injector 5 is 0.01 bar, the photo-thermal response conductive paste 7 does not flow out of the micro-pores of the micro-nozzle.

When injection is needed, the bottom surface of the air pressure injector is adjusted to 5 μm away from the surface of the first chip bonding pad; the air pressure regulator adjusts the air pressure to 0.8 bar; due to the increase of the air pressure inside the air pressure injector 5, the photo-thermal response conductive paste 7 placed in the air pressure injector 5 is extruded from the micro-pores of the micro-nozzle and is connected to the first chip bonding pad 11; the surface of the photo-thermal response conductive paste 7 is cured in air to form an elastic interconnection wire 3.

When the interconnection wire 3 reaches a predetermined length, the air pressure regulator (not shown) reduces the air pressure to 0.01 bar and stops extruding the photo-thermal response conductive paste 7; meanwhile, the precision platform drives the air pressure injector 5 to move at a speed of 3~10 mm/s in the Y-axis direction, and the interconnection wire 3 is torn off;

The linear light source 4 is connected with the continuous laser generator, through the control of the precision platform, the linear light source 4 is moved to a predetermined irradiation point according to the required bending angle and length of the interconnection wire 3, and the laser is irradiated onto the interconnection wire 3, so that the interconnection wire 3 is bent towards the light;

Through the control of the precision platform (not shown), the extrusion mechanism 6 presses the free end of the interconnection wire 3 to the second chip bonding pad 21, so that the interconnection wire 3 is connected with the first chip 1 and the second chip 2; and finally, the first chip 1 and the second chip 2 which have completed connection are subjected to glue dripping encapsulation treatment.

In an embodiment, the photo-thermal responsive conductive paste includes the following components in parts by weight:

| | |
|---|---|
| 3-(4-((4-methoxyphenyl)diazo)phenoxy)acrylate | 9 parts; |
| diazo-1,2-bis(4,1-phenyl)diacrylate | 1 part; |
| azodiisobutyronitrile | 1.2~1.8 parts; |
| gallium indium alloy (99.99%) | 2 parts; |
| tetrahydrofuran | margin; |

Figure 7:
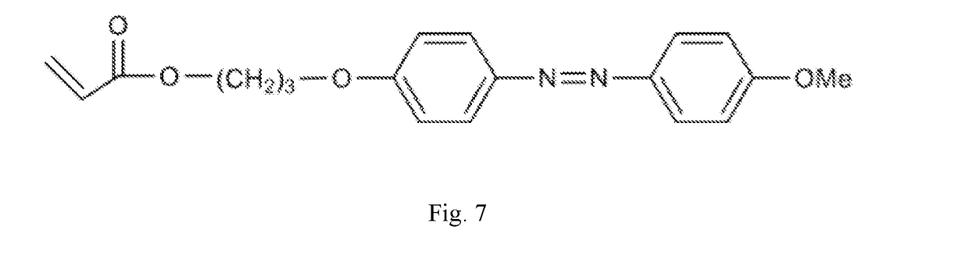
FIG. 7 is a structural formula of 3-(4-((4-methoxyphenyl) diazo) phenoxy) acrylate monomer.
Figure 8:
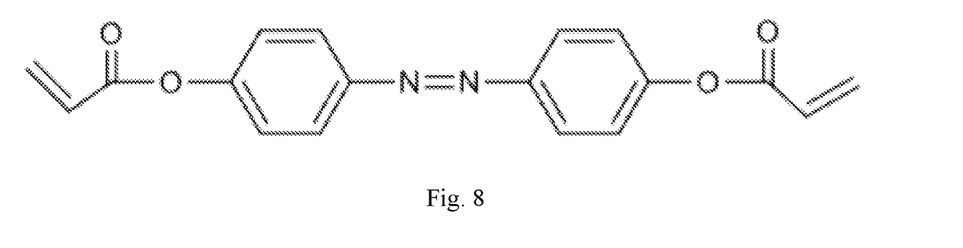
FIG. 8 is a structural formula of a diazo-1, 2-bis (4,1-phenyl) diacrylate monomer.

The photo-thermal response conductive paste adopts a liquid crystal elastomer containing azobenzene groups, and utilizes the principle of rapid thermal reduction reverse isomerization under ultraviolet irradiation of azobenzene groups in a chemical cross-linked polymer network, so that the interconnection wire 3 shrinks on an side of the light, and the volume of the interconnection wire 3 on a backlit side is kept unchanged, so that the purpose of bending the interconnection wire 3 towards the light is achieved. When the photo-thermal response conductive paste is 57° C., volume shrinkage can occur.

Further, a manufacturing method of the photo-thermal response conductive paste includes the following steps:

Step B1: adding 3-(4-((4-methoxyphenyl) diazo) phenoxy) acrylate, diazo-1,2-bis (4, 1-phenyl) diacrylate and azobisisobutyronitrile into tetrahydrofuran according to a ratio, wherein a reaction temperature is 65° C., and a reaction time is 40~60 h to obtain a precursor solution;

Step B2, drying the precursor solution into a dry matter, a drying temperature is 20° C., and a drying time is 12 h;

Step B3: mixing the eutectic gallium indium alloy with the dry matter according to a ratio, and carrying out vacuum ultrasonic dispersion for 10~15 min to obtain the photo-thermal response conductive paste.

The components are uniformly distributed through ultrasonic dispersion, and the components are crosslinked into a whole by acting as a cross-linking agent through diazo-1,2-bis (4,1-phenyl) diacrylate. The eutectic gallium indium alloy needs to be ultrasonically dispersed in a vacuum environment, so that oxygen is prevented from reacting with the eutectic gallium indium alloy to form an oxidized metal film, the conductive performance of the conductive path 3 is reduced, and azobisisobutyronitrile serves as a photoinitiator.

Further, the liner light source 4 is connected with a continuous laser generator, and the wavelength of light emitted by the continuous laser generator is 365 nm. The liner light source 4 is connected to the continuous laser generator and the continuous laser generator provides laser light. According to the photo-thermal response conductive paste prepared from the liquid crystal elastomer containing the azobenzene group, when the wavelength of light is 365 nm, the efficiency of converting the light energy into heat energy is better, and the conversion capability is more stable.

In a specific embodiment, the air pressure injector 5 in the step S3 moves in the Y-axis direction, and the moving rate is 3~10 mm/s. The eutectic gallium indium alloy reacts with oxygen to form an oxidized metal film. Therefore, oxygen in the air after extrusion can cause a certain degree of curing deformation of a part of the eutectic gallium indium alloy in the interconnection wire 3, but also maintains the viscoelastic state as a whole. The Y-axis direction is shown by the arrow in FIG. 2, in a preferred embodiment, the moving speed of the air pressure injector 5 is 5 mm/s, it can be guaranteed that the interconnection wire 3 can be torn off, meanwhile, the movement speed of the air pressure injector 5 is avoided to be too fast, the free end of the interconnection wire 3 is prevented from generating unnecessary offset, and the moving speed can be adjusted according to the viscosity of the photo-thermal response conductive paste 7.

Preferably, the irradiation time in the Step S4 is 40 s~60 s; after the laser is irradiated for 40 s~60 s, the photo-thermal response conductive paste 7 can reach a critical temperature, so that the volume on a side of the light shrinks, and thus the interconnection wire 3 is bent. After more than 60 s, the bending degree of the interconnection wire 3 is too large and cannot be connected with the second chip 2. In the preferred embodiment, an irradiation time is 50 s, and the interconnection wire 3 is bent just to 90° and is located above the second chip bonding pad 21.

Embodiment 1

Step S1, preparing 50 parts of N-isopropylacrylamide, 5 parts of N, N'-methylene bisacrylamide, 0.5 part of 2-hydroxy-2-methyl-1-phenyl-1-acetone in dimethyl sulfoxide to prepare a precursor solution, treating for 5 minutes in an ultrasonic oscillator, and then adding 0.3 part of reduced graphene and 20 parts of eutectic gallium indium alloy (99.99%) into the solution, processing the solution in an ultrasonic oscillator of a vacuum environment for 10 min, placing the solution in an ultraviolet light generator for treatment for 2 min, forming a photo-thermal response conductive paste 7, and putting the photo-thermal response conductive paste 7 into an air pressure injector;

Step S2, the air pressure regulator controls the air pressure output to be 0.01 bar and driving the air pressure injector, so that the micro-nozzle on the air pressure injector is aligned with the center position of the first chip bonding pad; when the bottom surface of the micro-nozzle (not shown in the drawings) is 5 μm from the surface of the first chip bonding pad, the air pressure regulator adjusts the air pressure to be 0.8 bar, and the air pressure injector extrudes the photo-thermal response conductive paste 7 so that the photo-thermal response conductive paste 7 is connected with the first chip to form a interconnection wire;

Step S3, when the length of the extruded interconnection wire is 250 μm, the air pressure regulator adjusts the air pressure down to 0.01 bar, the air pressure injector moves in a Y-axis direction by 5 mm/s under the driving of a precision platform, and the interconnection wire stops extruding and is pulled off;

Step S4, a liner light source is connected to a 532 nm continuous laser generator, through the control of the precision platform, the linear light source moves to 30 μm away from the upper surface of the first chip bonding pad in a Z-axis direction, the irradiation light of 532 nm parallel to the plane where the XY axis is located is generated, the irradiation light of 532 nm forms an irradiation spot on the interconnection wire, and continuously irradiating for 60 s, the interconnection wire generates a folding point at the spot, the bending angle is 90 degrees, and a free end of the interconnection wire is above the second chip bonding pad;

Step S5: through the control of the precision platform, the extrusion mechanism presses the free end of the interconnection wire to enable the free end of the interconnection wire 3 to be connected with the second chip bonding pad;

Step S6, after the first chip and the second chip are connected, the first chip and the second chip are subjected to glue dripping glue dripping encapsulation.

After the glue dripping encapsulation, the first chip and the second chip are connected through a interconnection wire and enable the first chip and the second chip to be communicated with each other.

Embodiment 2

Step S1, preparing 40 parts of N-isopropylacrylamide, 5 parts of N, N'-methylene bisacrylamide, 0.5 part of 2-hydroxy-2-methyl-1-phenyl-1-acetone in dimethyl sulfoxide to prepare a precursor solution, treating for 5 minutes in an ultrasonic oscillator, and then adding 0.3 part of reduced graphene and 10 parts of eutectic gallium indium alloy (99.99%) into the solution, processing the solution in an ultrasonic oscillator of a vacuum environment for 10 min, placing the solution in an ultraviolet light generator for treatment for 2 min, forming a photo-thermal response conductive paste 7, and putting the photo-thermal response conductive paste 7 into an air pressure injector;

Step S2, the air pressure regulator controls the air pressure output to be 0.01 bar and driving the air pressure injector, so that the micro-nozzle on the air pressure injector is aligned with the center position of the first chip bonding pad; when the bottom surface of the micro-nozzle is 5 μm from the surface of the first chip bonding pad, the air pressure regulator adjusts the air pressure to be 0.8 bar, and the air pressure injector extrudes the photo-thermal response conductive paste, so that the photo-thermal response conductive paste is connected with the first chip to form an interconnection wire;

Step S3, when the length of the extruded interconnection wire is 250 μm, the air pressure regulator adjusts the air pressure down to be 0.01 bar, the air pressure injector moves in a Y-axis direction by 3 mm/s under the driving of the precision platform, and the interconnection wire stops extruding and is pulled off;

Step S4, a liner light source is connected to a 532 nm continuous laser generator, through the control of the precision platform, the linear light source moves to 30 μm away from the upper surface of the first chip bonding pad in a Z-axis direction, the irradiation light of 532 nm parallel to the plane where the XY axis is located is generated, the irradiation light of 532 nm forms an irradiation spot on the interconnection wire, continuously irradiating for 40 s, the interconnection wire generates a folding point at the spot, the bending angle is 90 degrees, and a free end of the interconnection wire is above the second chip bonding pad;

Step S5, through the control of the precision platform, the extrusion mechanism presses the free end of the interconnection wire to enable the free end of the interconnection wire to be connected with the second chip bonding pad;

Step S6, after the first chip and the second chip are connected, the first chip and the second chip are subjected to glue dripping encapsulation.

After the glue dripping encapsulation, the first chip and the second chip are connected through a interconnection wire and enable the first chip and the second chip to be communicated with each other.

Embodiment 3

Step S1, adding 9 parts of 3-(4-((4-methoxyphenyl) diazo) phenoxy) propyl acrylate and 1 part of diazo-1,2-bis (4,1-phenyl) diacrylate into 1.2 parts of azobisisobutyronitrile, reacting for 60 hours in tetrahydrofuran at 65° C., and drying at 20° C. for 12 hours to obtain a dry matter; adding the dry matter into a eutectic gallium indium alloy for mixing, and then processing in an ultrasonic oscillator of a vacuum environment for 10 minutes to form a photo-thermal response conductive paste, and putting the photo-thermal response conductive paste into an air pressure injector;

Step S2, the air pressure regulator controls the air pressure output to be 0.01 bar and driving the air pressure injector, so that the micro-nozzle on the air pressure injector is aligned with the center position of the first chip bonding pad; when the bottom surface of the micro-nozzle is 5 μm from the surface of the first chip bonding pad, the air pressure regulator adjusts the air pressure to be 0.8 bar, and the air pressure injector extrudes the photo-thermal response conductive paste, so that the photo-thermal response conductive paste is connected with the first chip to form a interconnection wire;

Step S3, when the length of the extruded interconnection wire is 250 μm, the air pressure regulator adjusts the air pressure down to be 0.01 bar, the air pressure injector moves in a Y-axis direction by 10 mm/s under the driving of the precision platform, and the interconnection wire stops extruding and is pulled off;

Step S4, a liner light source is connected to a 365 nm continuous laser generator, through the control of the precision platform, the linear light source moves to 30 μm away from the upper surface of the first chip bonding pad in a Z-axis direction, the irradiation light of 365 nm parallel to the plane where the XY axis is located is generated, the irradiation light of 365 nm forms an irradiation spot on the interconnection wire, continuously irradiating for 40 s, the interconnection wire generates a folding point at the spot, the bending angle is 90 degrees, and a free end of the interconnection wire is above the second chip bonding pad;

Steps S5-S6 are consistent with the embodiment 1.

After the glue dripping encapsulation, the first chip and the second chip are connected through a interconnection wire and enable the first chip and the second chip to be communicated with each other.

Embodiment 4

Step S1, adding 9 parts of 3-(4-((4-methoxyphenyl) diazo) phenoxy) propyl acrylate and 1 part of diazo-1,2-bis (4,1-phenyl) diacrylate into 1.8 parts of azobisisobutyronitrile, reacting for 60 hours in tetrahydrofuran at 65° C., and drying at 20° C. for 12 hours to obtain a dry matter; adding the dry matter into a eutectic gallium indium alloy for mixing, and then processing in an ultrasonic oscillator of a vacuum environment for 15 minutes to form a photo-thermal response conductive paste, and putting the photo-thermal response conductive paste into an air pressure injector. Steps S2-S6 are consistent with the embodiment 3.

After the glue dripping encapsulation, the first chip and the second chip are connected through a interconnection wire and enable the first chip and the second chip to be communicated with each other.

The technical principle of the disclosure is described above in combination with specific embodiments. The description is merely for the purpose of illustrating the principles of the disclosure and is not to be construed in any way as a limitation on the scope of the disclosure. Based on the explanation herein, those skilled in the art does not require any creative effort to associate with other embodiments of the disclosure, all of the equivalent variations or substitutions are included within the scope defined by the claims of the application.

We claim:

1. A method for processing an ultra-high density interconnection wire under light source guidance, comprising the steps of:
    S1: preparing a photo-thermal response conductive paste, and putting the photo-thermal response conductive paste into an air pressure injector;
    S2: driving the air pressure injector, so that a micro-nozzle on the air pressure injector is aligned with a central position of a first chip bonding pad of a first chip; extruding, by the air pressure injector, the photo-thermal response conductive paste onto the first chip bonding pad; a surface of the photo-thermal response conductive paste is cured in air, so that the photo-thermal response conductive paste forms an interconnection wire and connects to the first chip;
    S3: stopping extruding the photo-thermal response conductive paste, and driving the air pressure injector to pull off the interconnection wire;
    S4: emitting light and irradiating, by a linear source, on the interconnection wire to bend a free end of the interconnection wire and bend to an upper side of a second chip bonding pad;
    S5: pressing, by an extrusion mechanism, the free end of the interconnection wire on the second chip bonding pad, so that the interconnection wire connects the first chip and a second chip; and
    S6: after the first chip and the second chip are connected, encapsulating the first chip and the second chip by dispensing glues on the first chip and the second chip.

2. The method for processing an ultra-high density interconnection wire under light source guidance according to claim 1, wherein the photo-thermal response conductive paste includes the following components in parts by weight:

| | |
|---|---|
| N-Isopropylacrylamide | 40-50 parts; |
| N,N'-methylene bisacrylamide | 5 parts; |
| 2-hydroxy-2-methyl-1-phenyl-1-acetone | 0.5 parts; |
| reduced graphene | 0.3 parts; |
| eutectic gallium indium alloy | 10 parts; |
| dimethyl sulfoxide | margin; | the purity of the eutectic gallium indium alloy is 99.99%.

3. The method for processing an ultra-high density interconnection wire under light source guidance according to claim 2, wherein a preparation method of the photo-thermal response conductive paste includes the following steps:
    Step A1: placing N-isopropylacrylamide, N, N'-methylene bisacrylamide and 2-hydroxy-2-methyl-1-phenyl-1-acetone in dimethyl sulfoxide according to a ratio, and carrying out ultrasonic dispersion for 5 min to obtain a precursor solution;
    Step A2: adding the reduced graphene and the eutectic gallium indium alloy into a precursor solution according to a ratio, and performing ultrasonic dispersion for 10 min under a vacuum environment; wherein the purity of the eutectic gallium indium alloy is 99.99%;
    Step A3: placing the solution in the Step A2 in an ultraviolet light generator for reaction for 2 min to obtain the photo-thermal response conductive paste.

4. The method for processing an ultra-high density interconnection wire under light source guidance according to claim 2, wherein the linear light source is connected with a continuous laser generator, and the wavelength of the light emitted by the continuous laser generator is 532 nm.

5. The method for processing an ultra-high density interconnect wire under light source guidance according to claim 1, wherein the photo-thermal response conductive paste includes the following components in parts by weight:

| | |
|---|---|
| 3-(4-((4-methoxyphenyl)diazo)phenoxy)acrylate | 9 parts; |
| diazo-1,2-bis(4,1-phenyl)diacrylate; | 1 part; |
| azodiisobutyronitrile | 1.2~1.8 parts; |
| eutectic gallium indium alloy | 2 parts; |
| tetrahydrofuran | margin; | the purity of the eutectic gallium indium alloy is 99.99%.

6. The method for processing an ultra-high density interconnect wire under light source guidance according to claim 5, wherein a manufacturing method of the photo-thermal response conductive paste includes the following steps:
Step B1: adding 3-(4-((4-methoxyphenyl) diazo) phenoxy) acrylate, diazo-1,2-bis (4, 1-phenyl) diacrylate and azobisisobutyronitrile into tetrahydrofuran according to a ratio, wherein a reaction temperature is 65° C., and a reaction time is 40~60 h to obtain a precursor solution;
Step B2, drying the precursor solution into a dry matter, a drying temperature is 20° C., and a drying time is 12 h;
Step B3: mixing the eutectic gallium indium alloy with the dry matter according to a ratio, and carrying out vacuum ultrasonic dispersion for 10~15 min to obtain the photo-thermal response conductive paste.

7. The method for processing an ultra-high density interconnect wire under light source guidance according to claim 5, wherein the linear light source is connected with a continuous laser generator, and the wavelength of a light emitted by the continuous laser generator is 365 nm.

8. The method for processing an ultra-high density interconnection wire under light source guidance according to claim 1, wherein the air pressure injector in the step S3 is moved in the Y-axis direction, and a moving speed is 3~10 mm/s.

9. The method for processing an ultra-high density interconnection wire under light source guidance according to claim 1, wherein an irradiation time in the Step S4 is 40 s~60 s.

* * * * *